(12) United States Patent
Landry et al.

(10) Patent No.: US 8,498,830 B2
(45) Date of Patent: Jul. 30, 2013

(54) TESTING OF A BATTERY OF A COMPUTING DEVICE

(75) Inventors: John A. Landry, Spring, TX (US); Robert D. Matthews, Sugar Land, TX (US); John A. Wozniak, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 290 days.

(21) Appl. No.: 12/872,453

(22) Filed: Aug. 31, 2010

(65) Prior Publication Data

US 2012/0053870 A1 Mar. 1, 2012

(51) Int. Cl.
*G01R 31/36* (2006.01)
(52) U.S. Cl.
USPC ...... 702/63; 713/2; 702/57; 702/80; 320/106; 320/107; 320/108; 324/426; 439/919; 438/19
(58) Field of Classification Search
USPC .............................................. 702/57, 60, 63
See application file for complete search history.

(56) References Cited

U.S. PATENT DOCUMENTS

| | | | |
|---|---|---|---|
| 6,307,377 B1* | 10/2001 | Cummings et al. | 324/427 |
| 7,076,375 B2* | 7/2006 | Raichle et al. | 702/63 |
| 7,388,349 B2* | 6/2008 | Elder et al. | 320/104 |
| 7,498,767 B2* | 3/2009 | Brown et al. | 320/107 |
| 7,643,951 B2 | 1/2010 | Stewart | |
| 2005/0092824 A1 | 5/2005 | Hindermeyer et al. | |
| 2007/0096689 A1* | 5/2007 | Wozniak | 320/112 |
| 2009/0027056 A1 | 1/2009 | Huang et al. | |
| 2009/0309540 A1 | 12/2009 | Elder et al. | |
| 2011/0154005 A1* | 6/2011 | Landry et al. | 713/2 |

* cited by examiner

*Primary Examiner* — Jonathan C Teixira Moffat
*Assistant Examiner* — Stephanie Chang
(74) *Attorney, Agent, or Firm* — Scott Pojunas

(57) ABSTRACT

Example embodiments relate to testing of a battery of a computing device. In example embodiments, a battery test may include determining whether charge control is available for a battery and reading battery data from the battery based on whether charge control is available for the battery. In addition, in example embodiments, the battery test may include determining whether the battery should be replaced based on the battery data.

20 Claims, 5 Drawing Sheets

TESTING OF A BATTERY OF A COMPUTING DEVICE

BACKGROUND

Notebook computers and other portable computing devices generally include one or more batteries for providing power to the device in the absence of an Alternating Current (AC) power source. As the long-term viability of other components has increased, batteries have become one of the more common sources of problems in computing devices and are therefore commonly replaced under warranty.

To aid the manufacturer of the computing device or battery in troubleshooting problems encountered by customers, many systems include a battery test procedure for determining whether a battery is faulty and requires replacement. The reliability of these testing procedures is of significant importance, as reliable tests allow a manufacturer to avoid unnecessary expenses in replacing batteries that are not defective. In addition to reducing costs of the manufacturer, a reliable battery testing method also reduces false positives, thereby avoiding unnecessary inconvenience to the customer in replacing a properly-functioning battery.

BRIEF DESCRIPTION OF THE DRAWINGS

The following detailed description references the drawings, wherein.

DETAILED DESCRIPTION

As detailed above, the reliability of battery test procedures is of significant interest in reducing costs to a manufacturer and improving a customer's level of satisfaction by properly diagnosing system problems. Accordingly, various embodiments disclosed herein relate to highly-reliable battery test methods.

In particular, example embodiments disclosed herein relate to testing of a battery of a computing device. In example embodiments, a battery test may include determining whether charge control is available for a battery and reading battery data from the battery based on whether charge control is available for the battery. In addition, in example embodiments, the battery test may include determining whether the battery should be replaced based on the battery data.

In this manner, by using a charge control feature, example embodiments disclosed herein reliably diagnose each battery, even when multiple batteries are installed in the system. Furthermore, when it is determined that a battery should be replaced, example embodiments reliably determine whether the battery is under warranty and, if so, generate a failure identifier to be provided to the manufacturer in fulfilling a warranty claim. In addition, in some embodiments, the requirement for a calibration procedure may be determined and, if required, the appropriate calibration type may be determined and automatically executed or schedule for automatic execution. Additional embodiments and applications of such embodiments will be apparent to those of skill in the art upon reading and understanding the following description.

Figure 1:
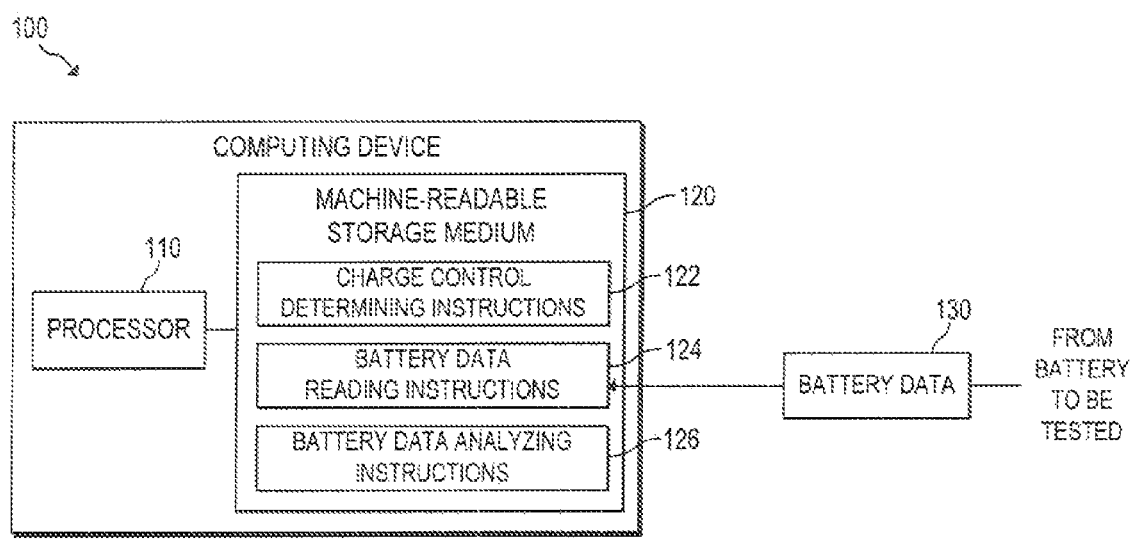
FIG. 1 is a block diagram of an example computing device including instructions for testing a battery of the computing device.

Referring now to the drawings, FIG. 1 is a block diagram of an example computing device 100 including instructions 122, 124, 126 for testing a battery of computing device 100. Computing device 100 may be, for example, a notebook computer, a slate computing device, a portable reading device, a wireless email device, a mobile phone, or any other computing device powered at least in part by one or more internal or external batteries. In the embodiment of FIG. 1, computing device 100 includes processor 110 and machine-readable storage medium 120.

Processor 110 may be one or more central processing units (CPUs), semiconductor-based microprocessors, and/or other hardware devices suitable for retrieval and execution of instructions stored in machine-readable storage medium 120. Processor 110 may fetch, decode, and execute instructions 122, 124, 126 to implement the battery testing procedure described in detail below. As an alternative or in addition to retrieving and executing instructions, processor 110 may include one or more integrated circuits (ICs) or other electronic circuits that include a number of electronic components for performing the functionality of one or more of instructions 122, 124, 126.

Machine-readable storage medium 120 may be any electronic, magnetic, optical, or other physical storage device that contains or stores executable instructions. Thus, machine-readable storage medium may be, for example, Random Access Memory (RAM), an Electrically Erasable Programmable Read-Only Memory (EEPROM), a storage drive, a Compact Disc Read Only Memory (CD-ROM), and the like. As described in detail below, machine-readable storage medium 120 may be encoded with a series of executable instructions for testing each battery that provides power to computing device 100 to determine whether each battery is functioning properly or should be replaced.

To implement the battery test procedure, machine-readable storage medium 120 may include charge control determining instructions 122. Determining instructions 122 may determine whether charge control is enabled for controlling a charging state of one or more batteries used to provide power to computing device 100. In other words, determining instructions 122 may determine whether computing device 100 has the capability of selectively toggling each installed battery between a charging and discharging state. In some computing devices, the charge control capability is provided by circuitry that enables selective application of charge to each battery using a keyboard controller or other hardware device. As detailed below, when a charge control feature is enabled for computing device 100, the battery test procedure may take advantage of this feature to more accurately read test data from the installed batteries, even when computing device 100 has access to multiple batteries.

The procedure for determining whether a charge control feature is enabled may vary depending on the particular implementation. In some embodiments, determining instructions 122 may first determine whether computing device 100 is currently coupled to AC power. If not, instructions 122 may determine that charge control is not currently enabled, as AC power may be required to take advantage of this feature. When AC power is available and only one battery is installed, determining instructions 122 may determine that charge control is available by switching AC power on and off. When AC power is available and multiple batteries are installed, determining instructions 122 may execute a query to determine whether computing device 100 includes a charge control feature. For example, when executing in an operating system (OS) environment, instructions 122 may issue a query to the Basic Input Output System (BIOS) of computing device 100 via a Windows Management Instrumentation (WMI) command or a similar command in another operating system. Alternatively, when executing in a Unified Extensible Firmware Interface (uEFI) environment, instructions 122 may issue the query directly to the BIOS. In response, the BIOS may return a code or other value indicating whether a hardware charge control feature is available.

Machine-readable storage medium 120 may also include battery data reading instructions 124, which may read battery data 130 from each battery to be tested based on whether charge control is enabled. For example, reading instructions 124 may receive an indication from charge control determining instructions 122 specifying whether charge control is supported and select a read procedure based on the received indication.

When charge control is not enabled, reading instructions 124 may simply read the test data 130 from each battery. On the other hand, when charge control is supported by computing device 100, reading instructions 124 may use a read procedure designed to improve the accuracy of the data 130 obtained from each battery. For example, reading instructions 124 may first reset each of the batteries that provide power to computing device 100 and, in some embodiments, may then confirm that each battery is in the reset state. Next, reading instructions 124 may set the battery to be tested to a charging state and confirm that the battery is in the charging state. Finally, reading instructions 124 may read the battery data 130 from the battery to be tested while the battery is in the charging state. In order to read the battery data, instructions 124 may issue a command to the battery via, for example, the BIOS and/or keyboard controller of computing device 100 and, in response, receive data 130 representing describing the battery. Reading instructions 124 may then repeat this procedure for each additional battery to be tested. By setting each battery to the charging state prior to reading the battery data 130, reading instructions 124 may improve the accuracy of the data 130 returned by the battery.

The particular commands used by reading instructions 124 to change the state of the batteries may vary depending on the implementation. It should be noted that the commands detailed below are presented as examples of possible commands. The particular command types, opcodes, input data, output data, and return codes may vary depending on the application environment (e.g., Windows, Linux, uEFI, etc.), battery type, and a number of other parameters.

In some embodiments, battery data reading instructions 124 may utilize a series of WMI commands to set the charging state and subsequently read the battery data 130. For example, in some embodiments, a WMI command for setting the charging state of each battery may be implemented according to the format specified in the following table:

TABLE 1

Example Set Battery Charge Control Command

| Opcode | Input Data | Return Codes |
|---|---|---|
| 1Fh | Byte 0 = Battery Selection<br>0 = Primary Battery<br>1 = Secondary Battery<br>Byte 1 = Sub command<br>0 = Reset selected battery<br>1 = Charge selected battery<br>2 = Discharge selected battery<br>Bytes 2-3 = Reserved | 00 = Success<br>34 h = Battery not available<br>35 h = Controller unable to perform command<br>36 h = Controller is busy |

In addition, a WMI command for determining the charging state of each battery may be implemented according to the format specified in the following table:

TABLE 2

Example Get Battery Charge Control Command

| Opcode | Output Data | Return Codes |
|---|---|---|
| 1Fh | Byte 0 = State of primary battery<br>0 = Reset (normal operation)<br>1 = Charging<br>2 = Discharging<br>Byte 1 = State of secondary battery<br>0 = Reset (normal operation)<br>1 = Charging<br>2 = Discharging<br>Bytes 2-3 = Reserved | 00 = Success<br>35 h = Controller unable to perform command |

The command for reading the battery data 130 may specify a battery number and may trigger return of a number of fields regarding the battery's design parameters (e.g., design capacity, design voltage, etc.), operating status (e.g., cell voltages, a terminal voltage, etc.), and other predetermined data fields (e.g., a manufacturer, serial number, etc.). As a specific example, when the battery complies with the Smart Battery System specification published by the Smart Battery System Implementers Forum (SBS-IF), a WMI command for retrieving the battery data 130 may be implemented according to the format specified in the following table:

TABLE 3

Example Get Battery Data Command

| Opcode | Input Data | Output Data |
|---|---|---|
| 07h | Byte 0 = Battery Selection<br>0 = Primary Battery<br>1 = Secondary Battery | Bytes 0-1 = Design capacity (mAh)<br>Bytes 2-3 = Last full charge capacity (mAh)<br>Bytes 4-5 = Remaining capacity (mAh)<br>Bytes 6-7 = Max error<br>Bytes 8-9 = Cycle count<br>Bytes 10-11 = Temperature (C.)<br>Bytes 12-13 = Voltage (mV)<br>Bytes 14-15 = Current (mA)<br>Bytes 16-17 = Design voltage (mV)<br>Bytes 18-19 = Status word<br>Bytes 20-21 = Cell voltage 1 (mV)<br>Bytes 22-23 = Cell voltage 2 (mV)<br>Bytes 24-25 = Cell voltage 3 (mV)<br>Bytes 26-27 = Cell voltage 4 (mV)<br>Bytes 28-43 = Serial number<br>Bytes 44-61 = Manufacturer<br>Bytes 62-77 = CT Label |

To give a specific example using the example commands detailed above, the commands for setting the charging state and reading the battery data 130 for two batteries may be as follows, assuming that charge control is enabled:

Write 1Fh 00xx [Reset batteries]
Read 1Fh 00xx [Confirm batteries are reset]
Write 1Fh 01xx [Set primary battery to charging]
Read 1Fh 01xx [Confirm primary battery is charging]
Read 07h 00xx [Read data from primary battery]
Write 1Fh 00xx [Reset batteries]
Read 1Fh 00xx [Confirm batteries are reset]
Write 1Fh 11xx [Set secondary battery to charging]
Read 1Fh 11xx [Confirm secondary battery is charging]
Read 07h 01xx [Read data from secondary battery]
Write 1Fh 00xx [Reset batteries]
Read 1Fh 00xx [Confirm batteries are reset]

Machine-readable storage medium 120 may also include battery data analyzing instructions 126, which may analyze the battery data 130 received for each battery to determine whether each battery is functioning properly or should instead be replaced. In determining whether the battery is functioning properly, analyzing instructions 126 may consider a number of properties of the battery using the fields included in the battery data 130 retrieved by reading instructions 124.

For example, in testing a particular battery, analyzing instructions 126 may first determine the design voltage of the battery using the battery data 130 and verify that the design voltage is within a predetermined range (e.g., between 7200 mV and 14400 mV) or is one of a number of predetermined values (e.g., 7200 mV, 7400 mV, etc.). When the design voltage is outside of the predetermined range or is not one of the predetermined values, instructions 126 may determine that the battery is faulty and should be replaced.

After checking the design voltage, instructions 126 may determine the number of cells in the battery based on the design voltage and a predetermined voltage per cell. Analyzing instructions 126 may then determine an operating voltage of each cell and determine a difference between the voltage of the cell with a minimum voltage and the voltage of the cell with a maximum voltage. When this difference exceeds a predetermined voltage (e.g., 500 mV), analyzing instructions 126 may determine that one or more of the cells of the battery are faulty and that the battery should therefore be replaced.

Analyzing instructions 126 may also consider the operating temperature of the battery in determining whether the battery should be replaced. For example, analyzing instructions 126 may read the current temperature of the battery from the battery data 130 and determine whether the temperature value is within a predetermined threshold temperature range (e.g., between 0° C. and 80° C.). If the temperature value is not within the predetermined threshold range, instructions 126 may determine that the battery is defective due to, for example, a faulty thermistor.

Analyzing instructions 126 may also compare a design capacity of the battery and a value representing a charge capacity of the battery when it last reached full capacity. When the last full charge capacity exceeds the design capacity of the battery, analyzing instructions 126 may determine that the battery should be replaced.

When charge control is available for the battery, analyzing instructions 126 may also verify that the battery is charging properly. For example, instructions 126 may first verify that the current at the power supply terminal of the battery is greater than 0 and, if not, determine that a fuse in the battery is blown. Instructions 126 may then verify that the voltage level at the power supply terminal of the battery exceeds a predetermined voltage, provided that the current at the power supply terminal is greater than a predetermined amperage (i.e., the battery is charging). This predetermined voltage may be selected based on the design voltage of the battery. To give a specific example, if the design voltage is between 1.4 V and 1.5 V, instructions 126 may verify that the terminal voltage is greater than or equal to 1 V when the current at the power supply terminal is at least 0.5 A. When the terminal voltage does not exceed the predetermined voltage when the battery is receiving the predetermined level of current, analyzing instructions 126 may determine that the battery is not properly charging and therefore determine that the battery should be replaced.

Alternatively, when AC power is unavailable or multiple batteries are installed and charge control is unavailable, analyzing instructions 126 may partially check the battery. In such cases, analyzing instructions 126 may omit the charging test and return a code indicating that the battery was not tested completely. For example, when AC power is unavailable, analyzing instructions 126 may return a code indicating that computing device 100 should be coupled to AC power and that the battery test should be repeated. Similarly, when multiple batteries are installed and charge control is unavailable, analyzing instructions 126 may return a code indicating that the user should remove all but one battery, run the test again, and repeat this procedure for each battery.

In some embodiments, analyzing instructions 126 may also include logic for reducing the likelihood of a false positive by testing for various fringe cases. For example, in some embodiments, analyzing instructions 126 may consider the temperature of the battery when the battery test indicates that the battery is not charging properly. For example, if the battery is operating outside of a normal temperature range, analyzing instructions 126 may return a code indicating that the battery should be tested again when it returns to a normal temperature. As another example of a fringe case, when the battery is in a state of very low charge or deep discharge (e.g., when any cell has a voltage of less than 3V), the results of the test may be inaccurate. Accordingly, in such cases, analyzing instructions 126 may return a code indicating that the battery has not been charged recently and should therefore be charged completely using AC power.

Additional details regarding example analyzing instructions 126 are provided in U.S. Pre-Grant Publication No. 2007/0096689, "Battery Analysis System and Method," to John A. Wozniak, incorporated by reference herein in its entirety. Furthermore, other factors and tests for consideration by analyzing instructions 126 in determining whether the battery is faulty will be apparent to those of skill in the art.

Figure 2:
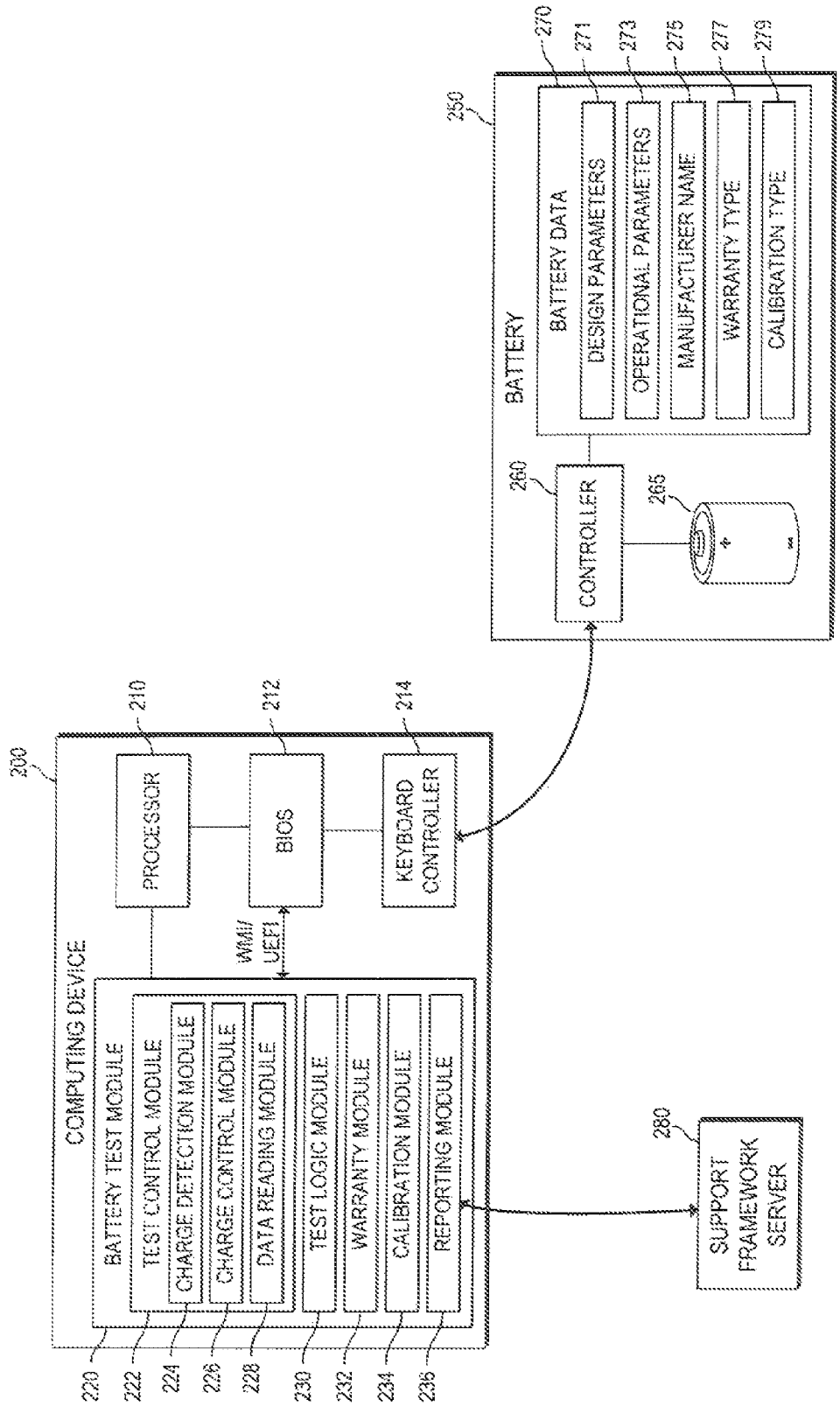
FIG. 2 is a block diagram of an example computing device in communication with a battery, the computing device including a battery test module for testing the battery.

FIG. 2 is a block diagram of an example computing device 200 in communication with a battery 250, the computing device 200 including a battery test module 220 for testing the battery 250. As detailed below, computing device 200 may retrieve battery data 270 from battery 250 and, using this data, determine whether battery 250 should be replaced.

As with computing device 100 of FIG. 1, computing device 200 may be a notebook computer, a slate computing device, a portable reading device, a wireless email device, a mobile phone, or any other computing device powered at least in part by one or more internal or external batteries, such as battery 250. As with processor 110, processor 210 may be a CPU or microprocessor suitable for retrieval and execution of instructions and/or one or more electronic circuits configured to perform the functionality of one or more of the modules 220-236 described below.

Basic Input/Output System (BIOS) 212 may include a series of instructions stored on a machine-readable storage medium (e.g., a Read Only Memory (ROM) chip or a flash memory device) for managing the hardware included in computing device 200. In addition to identifying, testing, and initializing hardware devices included in or coupled to computing device 200, BIOS 212 may also provide an interface for accessing these hardware devices to an operating system or uEFI environment running in computing device 200. For example, BIOS 212 may support a Windows Management Instrumentation (WMI) command set for receiving commands from the Windows OS environment (or a similar command set for an operating system other than Windows). Similarly, BIOS 212 may support a uEFI command set for receiving commands from an application running in a uEFI environment. In this manner, battery test module 220 may provide battery access commands to BIOS 212 and, in response, BIOS 212 may forward these commands to battery 250 via keyboard controller 214 or another hardware component of computing device 200.

Keyboard controller 214 may be a hardware device for receiving keyboard input that, in some embodiments, may also be in communication with a controller 260 of battery 250. For example, keyboard controller 214 may receive commands from battery test module 220 via BIOS 212 and, in response, emulate a smart battery selector to access battery 250 via controller 260. These commands may be, for example, commands to read battery data 270 or to control the charging state of battery 250. It should be noted that, in some embodiments, rather than using a keyboard controller 214, computing device 200 may issue commands to battery 250 via another hardware component of computing device 200, such as a dedicated microcontroller or other integrated circuit in communication with battery 250.

As detailed below, computing device 200 may include a series of modules 220-236 for testing the functionality of battery 250. Each of the modules may include, for example, one or more hardware devices including electronic circuitry for implementing the functionality described below. In addition or as an alternative, each module may be implemented as a series of instructions encoded on a machine-readable storage medium of computing device 200 and executable by processor 210. It should be noted that, in some embodiments, some modules are implemented as hardware devices, while other modules are implemented as executable instructions.

Battery test module 220 may manage the process of testing battery 250 and any other batteries that provide power to computing device 200. Thus, in some embodiments, battery test module 220 may execute as an application running in an operating system of computing device 200. Alternatively, battery test module 220 may execute as an application running in a Unified Extensible Firmware Interface (uEFI) environment of computing device 200. Regardless of the particular implementation, battery test module 220 may include a series of modules 222-236, each for executing a portion of the battery test.

Test control module 222 may control the procedure for detecting batteries available to computing device 200 and reading the battery data for each battery based on whether charge control is available. Thus, test control module 222 may include charge detection module 224, which may determine whether the computing device is currently coupled to an Alternating Current (AC) power source for charging battery 250. In making this determination, test control module 222 may, for example, use an Application Programming Interface (API) command provided by an operating system of computing device 200 to determine whether AC power is available. As another example, charge detection module 222 may determine whether AC power is available based on a query sent to BIOS 212 via a WMI or uEFI command.

Charge control module 226 may determine whether charge control is available for battery 250 and any other batteries available to computing device 200. In some embodiments, charge control module 226 may initially rely on the determination by charge detection module 224. For example, charge control module 226 may determine that charge control is unavailable when computing device 200 is not currently coupled to an AC power source. On the other hand, when computing device 200 is currently coupled to an AC power source, charge control module 226 may determine whether there are multiple batteries currently coupled to computing device 200 or, alternatively, whether battery 250 is the only battery coupled to computing device 200. When battery 250 is the only battery and AC power is available, charge control module 226 may determine that charge control is available, as computing device 200 may toggle battery 250 between a charging and discharging state based on selective application of AC power to battery 250.

Alternatively, when there are multiple batteries coupled to computing device 200, charge control module 226 may execute a query to determine whether a hardware charge control feature for controlling a charging state of each battery is available in computing device 200. Charge control module 226 may determine whether this feature is available by, for example, transmitting a query to BIOS 212. Additional details for one implementation of charge control module 226 are provided above in connection with charge control determining instructions 122 of FIG. 1.

Data reading module 228 may read battery data 270 from battery 250 based on whether charge control is available for battery 250. When charge control module 226 determines that charge control is not available, data reading module 228 may simply read data 270 from battery 250 based, for example, on transmission of a command to BIOS 212. Alternatively, when charge control module 226 determines that charge control is available, the read procedure may include resetting battery 250, setting battery 250 to a charging state, and reading battery data 270 after setting battery 250 to the charging state.

After data reading module 228 reads battery data 270, test logic module 230 may determine whether battery 250 should be replaced based on battery data 270. Test logic module 230 may consider, for example, the design voltage, voltage levels in each cell, terminal voltages and currents, the battery temperature, and a number of other factors. Test logic module 230 may also determine whether calibration is required. For example, test logic module 230 may read a maximum error field from battery data 270, which may represent an estimated error rate for the other operational values provided in battery data 270. When test logic module 230 determines that the maximum error value is greater than a predetermined value (e.g., 5 percent), test logic module 230 may determine that battery 250 should be calibrated.

In response to execution of the above-described analysis of battery data 270, test logic module 230 may return one or more result codes, each corresponding to a particular condition of the battery (e.g., functioning properly, requires replacement, requires calibration, etc.). Additional details of an example implementation of test logic module 230 are provided above in connection with battery data analyzing instructions 126 of FIG. 1.

Battery test module 220 may trigger execution of warranty module 232 when test logic module 230 determines that battery 250 should be replaced. Warranty module 232 may determine whether battery 250 is under warranty by determining a warranty length of battery 250, comparing the warranty length to an age value of battery 250, and determining that battery 250 is supported under warranty and should therefore be replaced under warranty when the warranty length is greater than the age value.

In determining the length of the warranty, warranty module 232 may, in some embodiments, extract a warranty type from a predetermined warranty field 277 or, alternatively, from another field in battery data 270, such as manufacturer name field 275. For example, the manufacturer name field 275 may be encoded such that the warranty type is separated from the manufacturer name using a delimiter (e.g., a colon, comma, slash, etc.). Warranty module 232 may then determine a warranty length corresponding to the particular warranty type (e.g., type "0" may correspond to 6 months, type "1" may correspond to 1 year, etc.). Alternatively, warranty module 232 may extract the warranty length directly from the manufacturer name field 275 or another field in battery data 270. In such instances, the warranty length may be encoded in battery data 270 as a number of months (e.g., 6, 12, 36, etc.) or years (e.g., 0.5, 1, 3, etc.).

To determine the age of the battery 250, warranty module 232 may, in some embodiments, calculate the age value as the lesser of an age of the computing device 200 and an age of the battery 250. To determine the age of computing device 200, warranty module 232 may, for example, access a record on computing device 200 or query a remote server using an identifier of computing device 200 (e.g., a serial number). To determine the age of battery 250, warranty module 232 may, for example, determine the value based on a manufacturing date of the battery obtained from battery data 270.

When warranty module 232 determines that the battery should be replaced under warranty, warranty module 232 may then generate and output a failure identifier, which may be a string of alphanumeric characters, an integer, or any other data type. In generating the failure identifier, warranty module 232 may encode various fields that may be used by a support agent in identifying computing device 200 and the customer's entitlement to a replacement of the battery 250 under warranty. For example, warranty module 230 may receive, as input, a system serial number, a date the battery test executed, a system warranty start date, and/or a test failure code outputted by test logic module 230. In response, warranty module 230 may output a value that encodes a product identifier (e.g., a model number), the failure code, the warranty start date, and/or an indication that the battery is supported under warranty. Upon receipt of a failure identifier from a customer, the support agent may trigger parsing of the failure identifier to start the battery replacement process.

Alternatively, when the battery should be replaced, but warranty module 232 determines that the battery is no longer covered by the warranty, warranty module 232 may output a message to this effect. In some embodiments, warranty module 232 may also output a selectable element for purchasing a replacement battery. For example, warranty module 232 may identify the battery type and display a Uniform Resource Locator (URL) directing the customer to a website where he or she may purchase a new battery.

Calibration module 234 may be triggered to manage a calibration process when test logic module 230 determines that calibration of battery 250 should be performed. Upon return of a calibration code by test logic module 230, calibration module 234 may first identify a calibration type of battery 250 using battery data 270. For example, some batteries may be calibrated by fully charging the battery, then fully discharging the battery. Other batteries may require an additional full charge and/or a wait period after charging the battery.

To identify the calibration type for battery 250, calibration module 234 may, for example, attempt to access a predetermined field included in battery data 270 listing the type (e.g., Type 1, Type 2, etc.). The calibration type may be a separate field 279 in battery data 270 or, alternatively, may be encoded in another field in battery data 270, such as the manufacturer name field 275. When calibration module 234 fails to read the calibration type from battery data 270, calibration module 234 may determine the calibration type using other information from battery data 270. For example, calibration type may access a table or other similar data structure to determine the calibration type based on the manufacturer name 275 of battery 250 and/or a model identifier of computing device 200.

After identifying the appropriate calibration type, calibration module 234 may determine whether an automatic calibration procedure is supported for battery 250 for the particular calibration type. For example, calibration module 234 may support an automatic procedure for a predefined group of calibration types, while requiring manual calibration by a user for other types. When calibration module 234 determines that automatic calibration is supported, calibration module 234 may immediately start the calibration procedure for the identified calibration type or, alternatively, schedule the calibration procedure for a future time. The automatic calibration procedure may be executed by, for example, a uEFI application running in computing device 200. On the other hand, when automatic calibration is not supported, calibration module 234 may output a series of steps of the manual calibration procedure for the identified calibration type, such that the user of computing device 200 may manually execute the calibration procedure.

Reporting module 236 may be in communication with a support framework server 280 for communication of the results of the test of battery 250. For example, upon completion of test logic module 230, reporting module 236 may prepare and transmit a message identifying various parameters of the test, such as the execution date, battery type, battery count, test result code, test duration, battery data, and the like. In this manner, the manufacturers of computing device 200 and/or battery 250 may gather and analyze data regarding the batteries installed in customer devices.

Battery 250 may be any type of battery suitable for provision of power to computing device 200. Thus, battery 250 may be, for example, a Lithium Ion (Li-ion) battery, a Nickel Metal Hydride (Ni-MH) battery, a Nickel Cadmium (Ni—Cd) battery, or any other battery type. In some embodiments, battery 250 may be implemented in accordance with the Smart Battery System specification published by the SBS-IF.

Controller 260 may include electrical circuitry that executes logic for managing battery 250. For example, controller 260 may be a semiconductor-based microprocessor, a microcontroller, or any other hardware device suitable for receiving and processing requests or commands from computing device 200, managing charging and discharging of cells 265, maintaining battery data 270, and executing other procedures required for the proper operation of battery 250.

Battery cells 265 may include one or more battery cells that store chemical energy suitable for conversion into electrical energy. Thus, as mentioned above, each battery cell 265 may be a Li-ion cell, Ni-MH cell, NiCd cell, or other type of battery cell. In operation, chemical reactions in each of the cells 265 may generate energy, which, in turn, may be converted into electrical energy for powering computing device 200.

Battery data 270 may include data describing various properties of battery 250. Battery data 270 may be maintained in battery 250 in one or more memory registers. Alternatively, battery data 270 may be maintained in a machine-readable storage medium, such as an Electrically Erasable Programmable Read Only Memory (EEPROM). In operation, battery data 270 may be maintained by controller 260 based on monitoring of the operation of battery 250.

In some embodiments, battery data 270 may include design parameters 271, operational parameters 273, manufacturer name 275, warranty type 277, and calibration type 279. Design parameters 271 may maintain data regarding characteristics of the battery as designed, such as a design capacity, design voltage, and serial number. Operational parameters 273 may maintain data regarding characteristics of the battery as currently operating, such as a last full charge capacity, a remaining capacity, an estimated error rate, a cycle count, an operating temperature, a terminal voltage and current, and voltages of each cell. Manufacturer name 275 may identify the manufacturer of battery 250, which, as described above, may be used in identifying the warranty length and calibration type. Warranty type 277 and calibration type 279 may be encoded in separate fields or, alternatively, may be included in another field, such as manufacturer name 275. An example of the various fields included in battery data 270 is presented above in Table 3.

Figure 3:
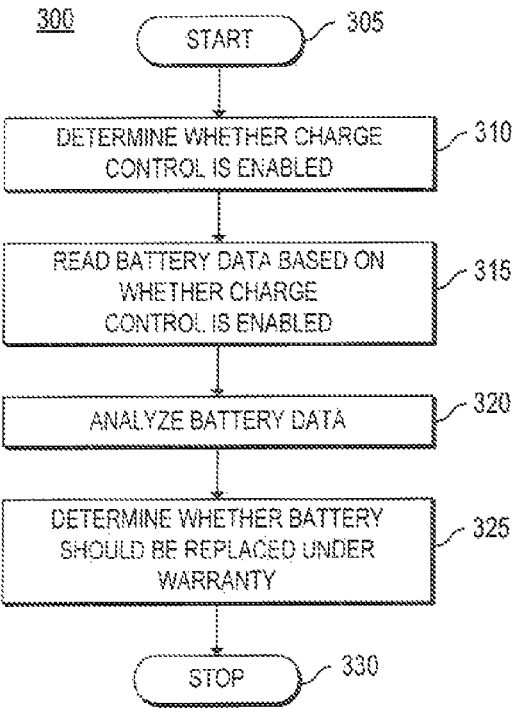
FIG. 3 is a flowchart of an example method for testing a battery of a computing device.

FIG. 3 is a flowchart of an example method 300 for testing a battery of a computing device 100. Although execution of method 300 is described below with reference to computing device 100, other suitable components for execution of method 300 will be apparent to those of skill in the art (e.g., computing device 200). Method 300 may be implemented in the form of executable instructions stored on a machine-readable storage medium, such as storage medium 120, and/or in the form of electronic circuitry.

Method 300 may start in block 305 and proceed to block 310, where computing device 100 may determine whether charge control is enabled for controlling a charging state of each battery that provides power to computing device 100. For example, computing device 100 may determine that charge control is enabled when AC power is present and either one battery is installed or multiple batteries are installed with a charge control feature present. Otherwise, computing device 100 may determine that charge control is not enabled.

Method 300 may then proceed to block 315, where computing device 100 may read the battery data from the battery using a read procedure selected based on whether charge control is enabled. For example, when charge control is not enabled, computing device 100 may simply read the battery data from each battery. Alternatively, when charge control is enabled, computing device 100 may, for each battery, reset the battery, set the battery to a charging state, and read the battery data after setting the battery to the charging state. As detailed above, following this procedure may provide for more accurate test data from the battery.

After computing device 100 reads the battery data, method 300 may proceed to block 320, where computing device 100 may analyze the battery data to determine whether the battery should be replaced. Computing device 100 may, for example, analyze the design voltage, voltage levels in each cell, terminal voltages and currents, battery temperature, and a number of other factors for various signs of battery failure. Additional implementation details are provided above in connection with battery data analyzing instructions 126 of FIG. 1.

When computing device 100 determines that the battery should be replaced, method 300 may proceed to block 325. In block 325, computing device 100 may determine whether the battery should be replaced under warranty by first determining a warranty length and a battery age using the battery data. For example, computing device 100 may extract the warranty length from a field in the battery data, which may be a separate field or a field holding data for another element (e.g., a manufacturer name). Computing device 100 may then determine the battery age by, for example, determining the time difference between the current date and a manufacturing date of the battery obtained from the battery data. In some embodiments, computing device 100 may then set the battery age to the lesser of the age determined using the manufacturing date and an age of computing device 100.

After determining the warranty length and age value, computing device 100 may compare the two values. When the warranty length is greater than the battery age, computing device 100 may determine that the battery should be replaced under warranty and, in some embodiments, may output a failure identifier containing details regarding the test results. Method 300 may then proceed to block 330, where method 300 may stop.

Figure 4:
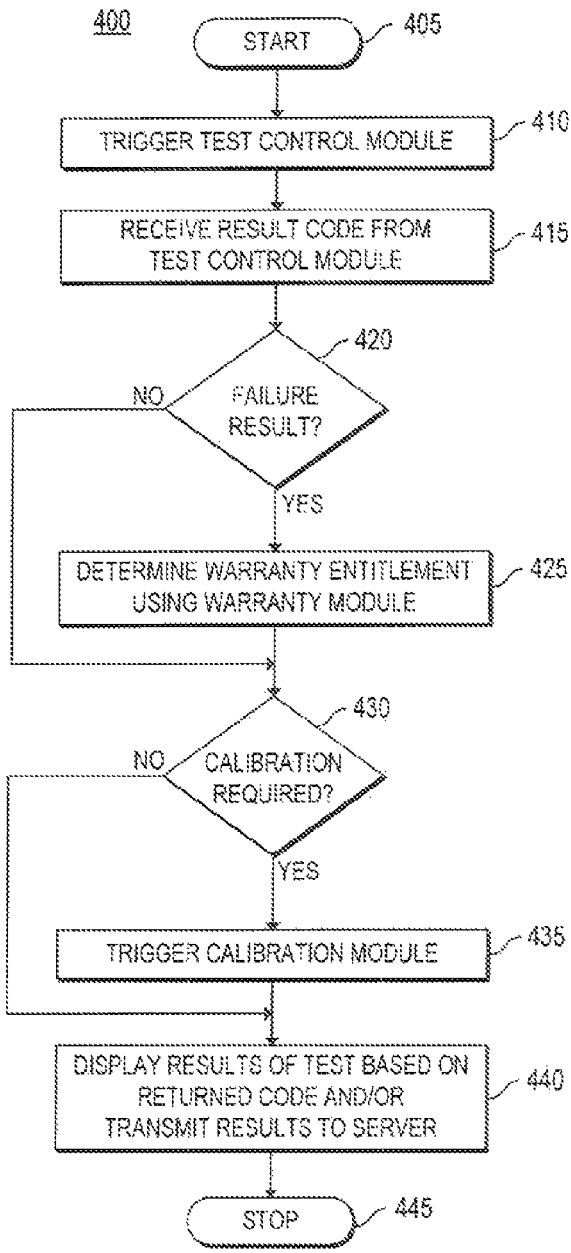
FIG. 4 is a flowchart of an example method executed by a battery test module for testing a battery of a computing device.

FIG. 4 is a flowchart of an example method 400 executed by a battery test module 220 for testing a battery 250 of a computing device 200. Although execution of method 400 is described below with reference to computing device 200 and, more specifically, battery test module 220, other suitable components for execution of method 400 will be apparent to those of skill in the art. Method 400 may be implemented in the form of executable instructions stored on a machine-readable storage medium and/or in the form of electronic circuitry.

Method 400 may start in block 405 and proceed to block 410, where battery test module 220 may trigger test control module 222 to manage the test of battery 250. An example method executed by test control module 222 is described below in connection with FIGS. 5A & 5B. As detailed below, test control module 222 may manage the test process and return a result code to battery test module 220. Thus, in block 415, battery test module 220 may receive the result code from test control module 222.

Method 400 may then proceed to block 420, where battery test module 220 may determine whether the result code indicates a test failure. If so, method 400 may proceed to block 425, where battery test module 220 may trigger execution of warranty module 232 to determine whether the customer is entitled to replacement of the battery 250 under warranty. An example method executed by warranty module 232 is described below in connection with FIG. 6. After execution of warranty module 232, method 400 may proceed to block 430. Alternatively, when it is determined in block 420 that the result code does not indicate a battery failure, method 400 may proceed directly to block 430.

In block 430, battery test module 220 may determine whether the result code indicates that battery 250 should be calibrated. If so, method 400 may proceed to block 435, where battery test module 220 may trigger execution of calibration module 234 to manage the calibration procedure. An example method executed by calibration module 234 is described below in connection with FIG. 7. After execution of calibration module 234, method 400 may proceed to block 440. Alternatively, when it is determined in block 430 that calibration is not required, method 400 may proceed directly to block 440.

In block 440, battery test module 220 may display the results of the test, indicating, for example, whether battery 250 is functioning properly and, if not, details on obtaining a new battery. In some embodiments, battery test module 220 may also trigger reporting module 236 for transmission of the results to a remote server, such as support framework server 280. Method 400 may then proceed to block 445, where method 400 may stop.

Figure 5A:
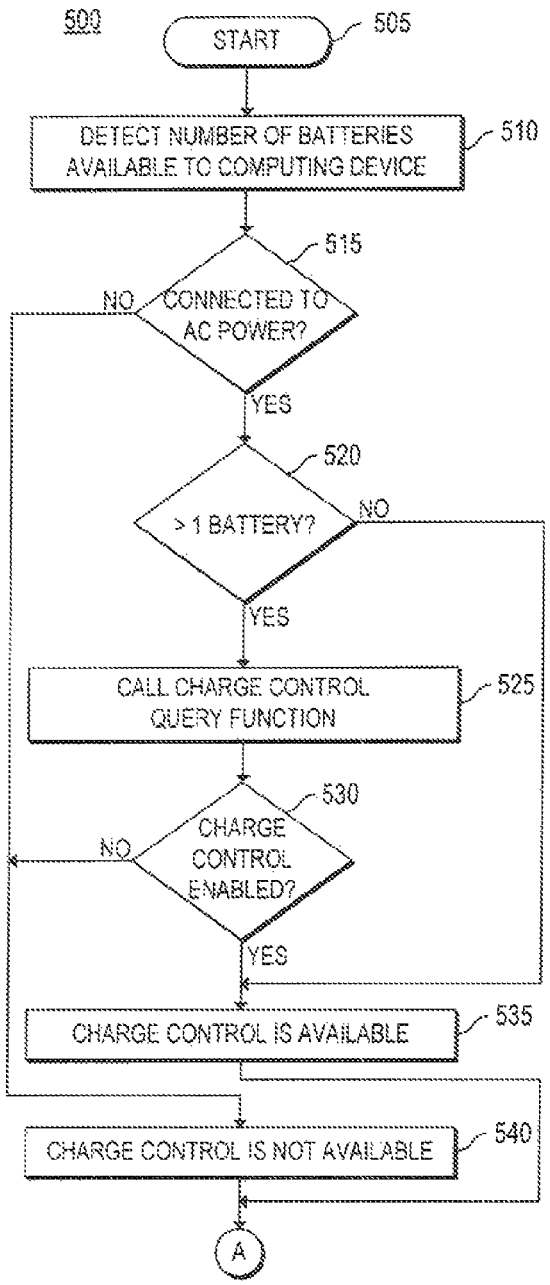
FIGS. 5A and 5B are flowcharts of an example method executed by a battery test control module for controlling a test of a battery of a computing device.
Figure 5B:
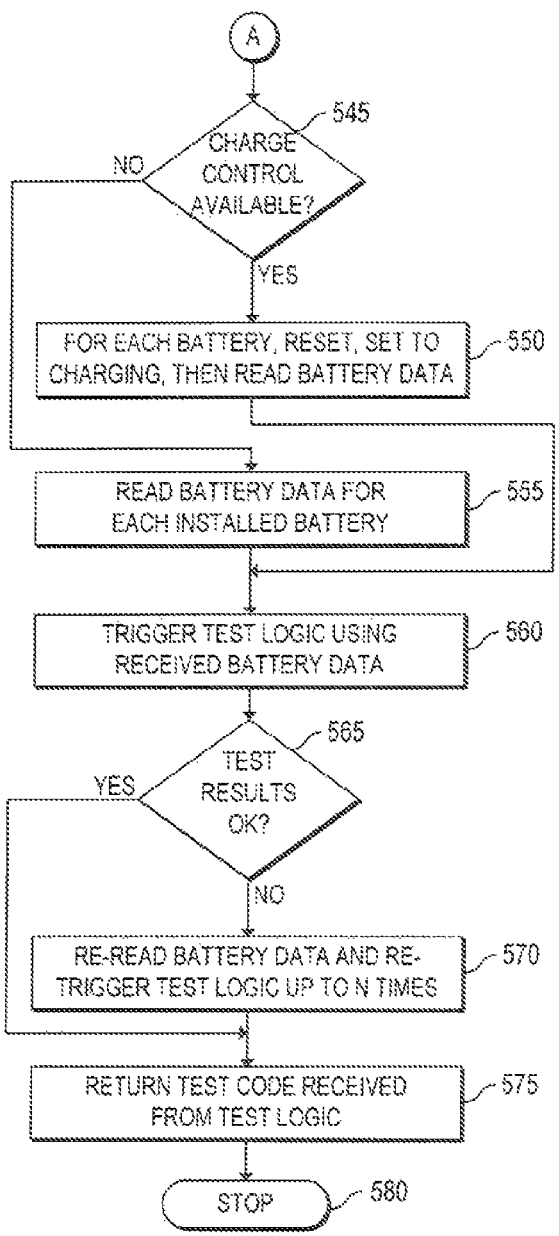

FIGS. 5A and 5B are flowcharts of an example method 500 executed by a battery test control module 222 for controlling a test of a battery 250 of a computing device 200. Although execution of method 500 is described below with reference to computing device 200 and, more specifically, test control module 222, other suitable components for execution of method 500 will be apparent to those of skill in the art. Method 500 may be implemented in the form of executable instructions stored on a machine-readable storage medium and/or in the form of electronic circuitry.

Method 500 may start in block 505 and proceed to block 510, where test control module 222 may detect the number of batteries available to computing device 200. Test control module 222 may, for example, retrieve battery information for each battery up to a total number of supported batteries of computing device 200. Based on whether one or more fields in the battery data include actual data, test control module 222 may determine a count of the batteries available to provide power to computing device 200. For example, test control module 222 may determine that a particular battery is available when either a manufacturer name field or serial number is not empty or null and that the battery is not available when both fields are empty or null.

After test control module 222 determines the number of batteries, method 500 may proceed to block 515, where test control module 222 may utilize charge detection module 224 to determine whether computing device 200 is currently coupled to AC power. If not, method 500 may proceed to block 540 where test control module 222 may determine that charge control is not available. Method 500 may then proceed to block 545 of FIG. 5B. Alternatively, when test control module 222 determines that computing device 200 is currently coupled to AC power, method 500 may proceed to block 520.

In block 520, test control module 222 may determine whether more than one battery is available based on the battery count determined in block 510. If only one battery is available, test control module 222 may proceed to block 535, where module 222 may determine that charge control is available, as the battery may be toggled between charging and discharging by switching AC power on and off. Method 500 may then proceed to block 545 of FIG. 5B. Alternatively, when test control module 222 determines that multiple batteries are installed, method 500 may proceed to block 525.

In block 525, test control module 222 may utilize charge control module 226 to call a charge control query function provided by BIOS 212 of computing device 200. In response, test control module 222 may receive an indication as to whether a hardware charge control feature is available in computing device 200. If this feature is available, method 500 may proceed to block 535, where module 222 may determine that charge control is available. Alternatively, if a hardware charge control feature is not available, method 500 may proceed to block 540, where module 222 may determine that charge control is not available. After either block 535 or block 540, method 500 may proceed to block 545 of FIG. 5B.

Referring now to FIG. 5B, in block 545, test control module 222 may determine whether charge control is available based on the determination in either block 535 or block 540. If charge control is available, method 500 may proceed to block 550, where test control module 222 may execute a read procedure that takes advantage of the availability of charge control. For example, module 222 may, for each available battery to be tested, reset all batteries, set the battery to be tested to charging, and then read the battery data while the battery is charging. As detailed above, use of this procedure may improve the accuracy of the battery data 270 returned by the battery. Alternatively, when it is determined in block 545 that charge control is not available, method 500 may proceed to block 555, where test control module 222 may simply read the battery data 270 from each available battery.

After execution of either block 550 or block 555, method 500 may proceed to block 560, where test control module 222 may trigger execution of test logic module 230. As detailed above in connection with FIG. 2, test logic module 230 may analyze a plurality of data items included in battery data 270 to determine whether the battery should be replaced and/or whether the battery requires calibration.

After test control module 222 triggers test logic module 230 and receives a test code representing the results of the test, method 500 may proceed to block 565. In block 565, test control module 222 may determine whether the results of the test indicate a failure. If so, method 500 may proceed to block 570, where test control module 222 may re-read the battery data and trigger the test logic up to a predetermined number of times (e.g., 3 times). In this manner, test control module 222 may confirm that the test results are due to a faulty battery and are not a false failure due to, for example, a battery communication issue. Method 500 may then proceed to block 575. Alternatively, when it is determined in block 565 that the test results did not indicate a failure, method 500 may skip directly to block 575.

In block 575, test control module 222 may return the result code received from test logic module 230 to battery test module 220. Method 500 may then proceed to block 580, where method 500 may stop.

Figure 6:
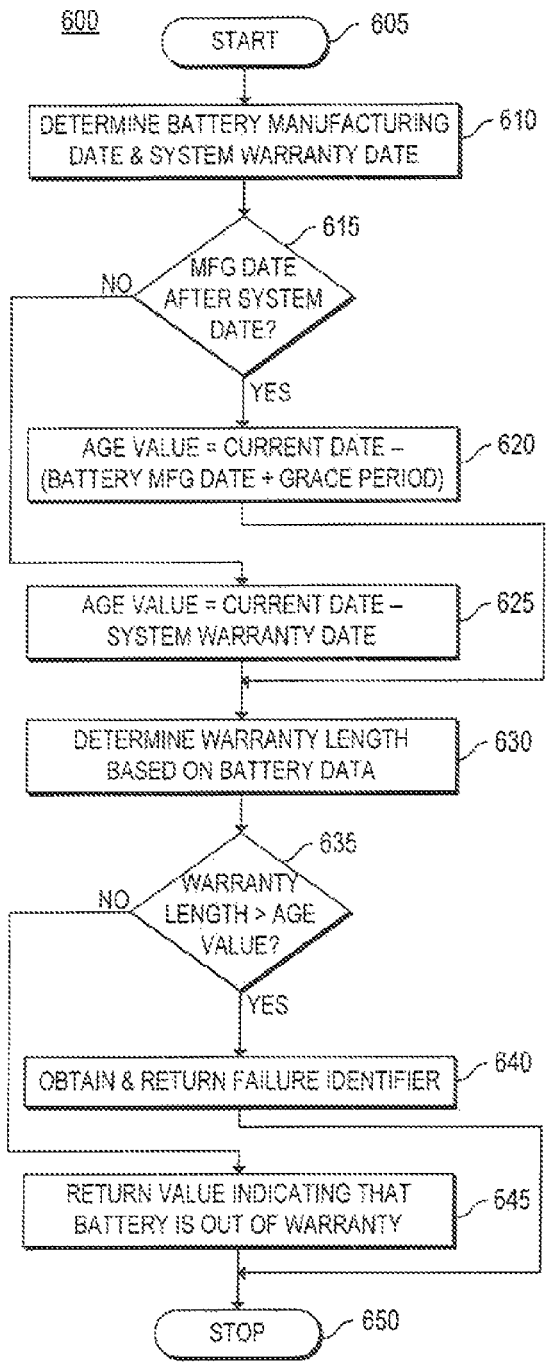
FIG. 6 is a flowchart of an example method executed by a warranty module for determining whether a battery of a computing device is under warranty.

FIG. 6 is a flowchart of an example method 600 executed by a warranty module 232 for determining whether a battery 250 of a computing device 200 is under warranty. Although execution of method 600 is described below with reference to computing device 200 and, more specifically, warranty module 232, other suitable components for execution of method 600 will be apparent to those of skill in the art. Method 600 may be implemented in the form of executable instructions stored on a machine-readable storage medium and/or in the form of electronic circuitry.

Method 600 may start in block 605 and proceed to block 610, where warranty module 232 may determine the battery manufacturing date and the warranty date of computing device 200. To determine the battery manufacturing date, module 232 may, for example, read the date from battery data 270 returned by the battery 250. To determine the warranty date of computing device 200, module 232 may, for example, read the date from a predetermined location in a storage device of computing device 200 or, alternatively, contact a remote server to determine the date based on a serial number or other system identifier.

Method 600 may then proceed to block 615, where warranty module 232 may determine whether the manufacturing date of the battery is after the system date. If so, warranty module 232 may infer that the battery was purchased after the original purchase date of computing device 200. Method 600 may therefore proceed to block 620, where warranty module 232 may calculate an age value as the current date minus the sum of the battery manufacturing date and a predetermined grace period (e.g., 90 days). This value represents the age of the battery as calculated with reference to the manufacturing date of the battery. After determining this value, method 600 may proceed to block 630, described in detail below.

On the other hand, when it is determined in block 615 that the system date is on or after the battery manufacturing date, method 600 may proceed to block 625. In block 625, warranty module 232 may calculate the age value as the current date minus the system warranty date. Method 600 may then proceed to block 630.

In block 630, warranty module 232 may determine the warranty length using battery data 270 of the battery. For example, warranty module 232 may access a predetermined field 277 in battery data 270 that stores the warranty type, which may correspond to a warranty length. Alternatively, warranty module 232 may directly determine the warranty length using battery data 270.

After determining the warranty length, method 600 may proceed to block 635, where warranty module 232 may determine whether the warranty length is greater than the determined age value. If so, warranty module 232 may determine that the battery is still under warranty. Accordingly, method 600 may proceed to block 640, where warranty module 232 may generate and return a failure identifier that encodes information regarding the battery and the circumstances of the battery failure.

Alternatively, when it is determined in block 635 that the warranty length is not greater than the age value, warranty module 232 may determine that the battery is no longer covered under warranty. Accordingly, method 600 may proceed to block 645, where warranty module 232 may return a value indicating that the battery is no longer covered under warranty. In some embodiments, warranty module 232 may also provide a URL or other information that may be used by the consumer to purchase a new battery. After execution of either block 640 or 645, method 600 may proceed to block 650, where method 600 may stop.

Figure 7:
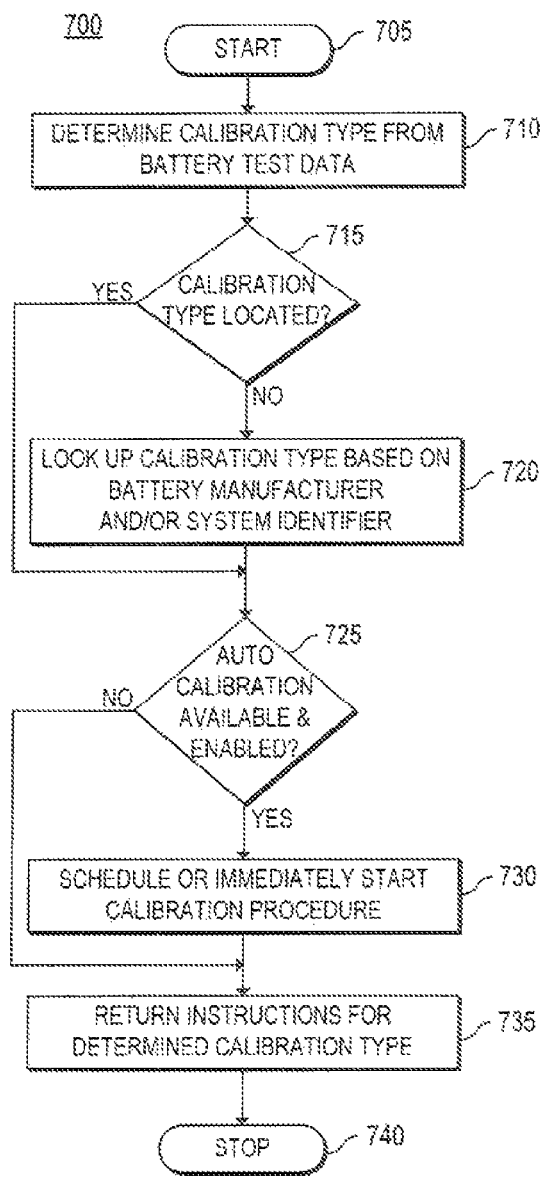
FIG. 7 is a flowchart of an example method executed by a calibration module for managing calibration of a battery of a computing device.

FIG. 7 is a flowchart of an example method 700 executed by a calibration module 234 for managing calibration of a battery 250 of a computing device 200. Although execution of method 700 is described below with reference to computing device 200 and, more specifically, calibration module 234, other suitable components for execution of method 700 will be apparent to those of skill in the art. Method 700 may be implemented in the form of executable instructions stored on a machine-readable storage medium and/or in the form of electronic circuitry.

Method 700 may start in block 705 and proceed to block 710, where calibration module 234 may determine the calibration type using battery data 270. Calibration module 234 may, for example, attempt to read the calibration type from a calibration type field 279 or another field in battery data 270.

Method 700 may then proceed to block 715, where calibration module 234 may determine whether the calibration type was located in battery data 270. If so, method 700 may skip directly to block 725, described in detail below. Alternatively, if the calibration type was not located in battery data 270, method 700 may proceed to block 720, where calibration module 234 may look up the calibration type using the battery manufacturer and/or an identifier of computing device 200. Method 700 may then proceed to block 725.

In block 725, computing device 200 may determine whether automatic calibration is available for the determined calibration type and, if so, whether the user has enabled automatic calibration. If so, method 700 may proceed to block 730, where calibration module 234 may immediately start the automatic calibration procedure or, alternatively, schedule the automatic calibration procedure for a future time. Method 700 may then proceed to block 740, where method 700 may stop.

Alternatively, if automatic calibration is unavailable for the determined calibration type or is disabled, method 700 may proceed to block 735. In block 735, calibration module 234 may retrieve and return manual calibration instructions for the determined calibration type. Method 700 may then proceed to block 740, where method 700 may stop.

According to the foregoing, example embodiments disclosed herein relate to a reliable battery test that thoroughly diagnoses each battery available in a system. For example, embodiments disclosed herein utilize a charge control feature to more reliably diagnose each battery of a computing device, even when multiple batteries are available. Furthermore, when it is determined that a battery should be replaced, example embodiments reliably determine whether the battery is supported under warranty. In addition, in some embodiments, the requirement for a calibration procedure may be determined and, if calibration is required, the appropriate calibration type may be determined and automatically executed or scheduled for automatic execution.

We claim:

1. A computing device comprising:
   a battery to provide power to the computing device; and
   a battery test module comprising:
      a charge detection module to determine whether the computing device is currently coupled to an Alternating Current (AC) power source for charging the battery,
      a charge control module to determine whether charge control is available for the battery, the charge control includes a charging state and a discharging state of the battery,
      a data reading module to read battery data from the battery using a read procedure selected based on whether charge control is available for the battery, and
      a test logic module to determine whether the battery should be replaced based on the battery data read by the data reading module,
   in which, when charge control is not available, the data module reads battery data from the battery.

2. The computing device of claim 1, further comprising:
   a keyboard controller in communication with a controller of the battery; and
   a Basic Input/Output System (BIOS) to receive commands from the battery test module and provide the commands to the keyboard controller for transmission to the controller of the battery.

3. The computing device of claim 1, wherein the battery test module executes as one of an application in an operating system of the computing device and an application in a Unified Extensible Firmware Interface (uEFI) environment of the computing device.

4. The computing device of claim 1, wherein the charge control module:
   determines whether there are multiple batteries coupled to the computing device, and
   determines that charge control is available when the battery is the only battery coupled to the computing device and the charge detection module determines that the computing device is currently coupled to an AC power source.

5. The computing device of claim 4, wherein the charge control module:
   determines, when there are multiple batteries coupled to the computing device, whether charge control is available by determining whether a hardware charge control feature for controlling a charging state of each battery is available in the computing device.

6. The computing device of claim 5, wherein, when charge control is available, the read procedure performed by the data reading module comprises:
   resetting the battery, setting the battery to a charging state, and reading the battery data from the battery after setting the battery to the charging state.

7. The computing device of claim 1, wherein the battery test module further comprises a warranty module to:
   determine whether the battery is under warranty when the test logic module determines that the battery should be replaced, and
   output a failure identifier when is determined that the battery is under warranty, and
   output a selectable element for purchasing a replacement battery when it is determined that the battery is not under warranty.

8. The computing device of claim 7, wherein to determine whether the battery is under warranty, the warranty module:
   determines an age value as the lesser of an age of the computing device and an age of the battery, and
   determines that the battery is under warranty when a length of the warranty of the battery is greater than the age value.

9. The computing device of claim 8, wherein the warranty module determines the length of the warranty of the battery using a value included in a manufacturer field of the battery data.

10. The computing device of claim 1, wherein the battery test module further comprises a calibration module to identify a calibration type of the battery using the battery data when the test logic module indicates that calibration of the battery should be performed.

11. The computing device of claim 10, wherein:
   to identify the calibration type, the calibration module attempts to read the calibration type from a calibration type field included in the battery data, and
   when the calibration module fails to read the calibration type from the battery data, the calibration module determines the calibration type based on at least one of a manufacturer of the battery and a model identifier of the computing device.

12. The computing device of claim 10, wherein:
   when an automatic calibration procedure is supported for the identified calibration type, the calibration module starts or schedules the automatic calibration procedure, and
   when the automatic calibration procedure is not supported for the identified calibration type, the calibration module outputs steps included in a manual calibration procedure corresponding to the identified calibration type.

13. The computing device of claim 1, further comprising:
   a reporting module to transmit results returned by the test logic module to a remote server.

14. A non-transitory machine-readable storage medium encoded with instructions executable by a processor of a computing device for battery testing, the machine-readable storage medium comprising:
   instructions for determining whether charge control is enabled for controlling a charging state and a discharging of each of a plurality of batteries that provide power to the computing device;
   instructions for determining whether charge control is enabled for the controlling a charging state of each of a plurality of batteries that provide power to the computing device;
   instructions for reading respective battery data from each battery using a read procedure based on whether charge control is enabled;
   instructions for analyzing respective battery data of each battery to determine whether each battery should be replaced; and
   instructions for reading battery data from the battery when charge control is not available.

15. The non-transitory machine-readable storage medium of claim 14, wherein, when it is determined that charge control is enabled for each of the plurality of batteries, the instructions for reading comprise, for each battery to be tested:
   resetting each of the plurality of batteries,
   setting the battery to be tested to a charging state, and
   reading the battery data from the battery to be tested.

16. The non-transitory machine-readable storage medium of claim 14, further comprising:
   instructions for reading the respective battery data to determine a warranty length for each battery that should be replaced, and
   instructions for determining whether each battery that should be replaced is supported under warranty using the determined warranty length.

17. The non-transitory machine-readable storage medium of claim 14, further comprising:
   instructions for reading the respective battery data to determine a calibration type for each battery determined to require calibration by the instructions for analyzing, and
   instructions for starting or scheduling an automatic calibration procedure for each battery for which the automatic calibration procedure is supported for the determined calibration type.

18. A battery test method comprising:
   determining, in a computing device, whether charge control is enabled for controlling a charging state and a discharging state of a battery that provides power to the computing device;
   reading battery data from the battery using a read procedure selected based on whether charge control is enabled;
   analyzing the battery data to determine whether the battery should be replaced; and
   determining whether the battery should be replaced under warranty based on whether a warranty length identified using the battery data is greater than an age value identified using the battery data;
   in which, if charge control is not available, the data reading module reads battery data from the battery.

19. The method of claim 18, wherein, when charge control is enabled, the read procedure comprises:
   resetting the battery,
   setting the battery to a charging state, and
   reading the battery data from the battery after setting the battery to the charging state.

20. The method of claim 18, further comprising:
   reading the battery data to determine a calibration type when the battery is determined to require calibration based on the analyzing, and
   scheduling or starting an automatic calibration procedure for the battery when the automatic calibration procedure is supported for the determined calibration type.

* * * * *

UNITED STATES PATENT AND TRADEMARK OFFICE
CERTIFICATE OF CORRECTION

PATENT NO. : 8,498,830 B2
APPLICATION NO. : 12/872453
DATED : July 30, 2013
INVENTOR(S) : John A. Landry et al.

Page 1 of 1

It is certified that error appears in the above-identified patent and that said Letters Patent is hereby corrected as shown below:

In the Claims

In column 16, line 34, in Claim 1, delete "data" and insert -- data reading --, therefor.

In column 17, line 9, in Claim 7, delete "when is" and insert -- when it is --, therefor.

In column 17, lines 56-57, in Claim 14, delete "discharging" and insert -- discharging state --, therefor.

In column 17, line 60, in Claim 14, delete "for the" and insert -- for --, therefor.

Signed and Sealed this
Twenty-sixth Day of November, 2013

Margaret A. Focarino
*Commissioner for Patents of the United States Patent and Trademark Office*